(12) United States Patent
Sowden et al.

(10) Patent No.: US 7,558,104 B2
(45) Date of Patent: Jul. 7, 2009

(54) POWER SAVING IN MEMORY ARRAYS

(75) Inventors: Andrew John Sowden, Cambridge (GB); David Anthony New, Cambridge (GB); Paul Darren Hoxey, Cambridge (GB); Simon Christopher Reynolds, Cambridge (GB)

(73) Assignee: ARM Limited, Cambridge (GB)

( * ) Notice: Subject to any disclaimer, the term of this patent is extended or adjusted under 35 U.S.C. 154(b) by 197 days.

(21) Appl. No.: 11/702,200

(22) Filed: Feb. 5, 2007

(65) Prior Publication Data

US 2008/0189483 A1    Aug. 7, 2008

(51) Int. Cl.
*G11C 11/00* (2006.01)

(52) U.S. Cl. .................... 365/154; 365/156; 365/189.05

(58) Field of Classification Search ................. 365/154, 365/156, 189.05
See application file for complete search history.

(56) References Cited

U.S. PATENT DOCUMENTS

| 4,982,365 A * | 1/1991 | Ohtani et al. ........... 365/189.11 |
| 2006/0274569 A1 * | 12/2006 | Joshi et al. .................. 365/154 |

* cited by examiner

*Primary Examiner*—Huan Hoang
(74) *Attorney, Agent, or Firm*—Nixon & Vanderhye P.C.

(57) ABSTRACT

An array of storage elements each comprising a data input and output and a feedback loop, substantially all of said feedback loops being formed with an asymmetry such that on power up when no input data signal is received a value is preferentially stored in said feedback loops such that substantially all of said storage elements will preferentially output a same value.

15 Claims, 6 Drawing Sheets

POWER SAVING IN MEMORY ARRAYS

FIELD OF THE INVENTION

The field of the invention relates to data processing and in particular to arrays of storage elements.

BACKGROUND

Data elements that are processed by a data processor are often stored in storage elements comprising feedback loops, the storage elements being arranged in an array.

FIG. 1 shows an array 10 of memory bit cells according to the prior art. The memory bit cells are formed from back to back inverters, and this is shown in both transistor and gate form. The conventional bit cell has a line of symmetry 20 in its feedback loop and is in fact designed to be as symmetrical as possible. Generally, during the design of these devices one side, side a, is designed and this is then turned over to form side b. Thus, the design of the two sides are in effect mirror images of each other and are identical. Clearly when the cells themselves are built then they will not be exactly identical due to manufacturing tolerances.

When these devices are powered up, due to slight variations in capacitance or other properties of the two sides either a one or a zero may be stored. Thus, in an array of these devices there will be a random number of ones and zeros stored following power up.

The symmetry of storage elements with feedback loops is desirable in many respects as it results in storage elements that are perfectly balanced and that therefore have essentially the same performance whether a one or a zero is stored. If they are asymmetrical they will preferentially hold a certain value and thus, to store the other value will require more power. Thus, there is a technical prejudice in the field to make such storage elements symmetrical.

However, there are situations such as following power up, where the memory array may be accessed in consecutive cycles when meaningful data is not stored in it. In such a case, if randomly different values are stored, then randomly different values will be accessed and output. Outputting different values will cause any output stage to toggle and this toggling will consume power. In the case that the data output is not meaningful this power consumption is not needed.

Furthermore, in multi banked RAMs for example one bank may have valid data and the other not. During an access all banks will be read but only one will have meaningful data. The other bankl(s) will consume power by being read. If they contain uniform data this power consumption will be reduced as any output stage will not need to toggle.

It would be desirable to reduce the power consumption of an array of storage elements.

SUMMARY

A first aspect provides an array of storage elements arranged in rows and columns, each storage element comprising a data input and output and a feedback loop, said storage elements in each column comprising feedback loops formed with an asymmetry such that on power up when no input data signal is received a value is preferentially stored in said feedback loops of said storage elements in said each column such that substantially all of said storage elements in said each column will output a same value.

Storage elements with feedback loops are conventionally designed to be symmetrical, generally being formed from identical devices having identical sizes. Thus, in for example, memory bit cells such as the 6T cells in SRAMs one side of the cell may be designed, and then this design is turned over to form the other side of the cell, such that one side is a mirror image of the other (see FIG. 1). This symmetry means that on power up the cells do not preferentially store a particular value. The present inventors recognized that in some situations the storage of random elements can be a cause of power loss. In particular, when the values stored in the array are not meaningful but the values are still output in consecutive cycles, then the storage of randomly different values in a same column will cause any output stage to that column to toggle and will increase power consumption. Thus, it would be advantageous if all elements in the same column stored the same values in circumstances where the values stored are not meaningful. However, achieving such a goal by, for example, writing a same value to all elements would in itself cost power.

The technology described here addresses this problem by forming the memory array from storage elements that have an asymmetry, such that all (or substantially all) storage elements in any column preferentially output the same value when they have no data input.

It should be noted that a reduction in power consumption will potentially be seen if a majority output the same value, but that the power advantage will increase if most or all of them output a same value. Given manufacture tolerances or other parameters it may be that a particular desired asymmetry is not achieved in all storage elements and thus, a few of the elements may output a different value. However, such an arrangement will still result in a power advantage It should also be noted that the skilled person would appreciate that the input and output may be a common port or they could be different ports.

In some embodiments, said array further comprises at least one output stage, said at least one output stage being formed to receive data to be output from a column of storage elements of said array and to hold said data until further data to be output is received at said output stage.

Arrays of storage elements generally comprise output stages that act to hold the data that is being output. The output stage is updated when new data is to be output. The storage elements are arranged such that on start up substantially all cells will output the same value. These outputs stages have a power cost associated with them when they change state. Thus, it is advantageous from a power point of view if they do not unnecessarily change state. In circumstances where it is unimportant what data is being output, for example during the running of power critical code or when the device is turned on or when it is powered up from sleep mode then it is advantageous if all or substantially all of the storage elements output the same value such that the output stage does not toggle unnecessarily. Generally the power saving is predominately within the output latch and driver rather than in the storage elements themselves.

In some embodiments substantially all of said storage elements are formed from feedback loops comprising a same asymmetry, such that substantially all of said feedback loops preferentially store a same value.

Although each column outputting a same value produces the power saving effect, in some embodiments the whole array is arranged to output the same value. Generally, in order for each storage element to output the same value, then they should store the same value. Thus, in embodiments they are formed with the same asymmetry such that when there is no input they will all, or substantially all, preferentially store a same value. It should be noted that in certain other embodiments the elements can be arranged to store different values, provided the outputs are arranged such that the same value is output.

Although the output stage can take a number of forms, in some embodiments it comprises a latch.

The storage elements can take a number of forms, in some embodiments the storage elements comprise latches while in others they may comprise flip flops.

In other embodiments, the storage elements comprise memory bit cells, the feedback loops comprise a pair of back to back inverters and the array comprises an SRAM memory.

A skilled person would appreciate that memory bit cells have two outputs a bit line and an n-bit line. Embodiments are arranged such that substantially all memory bit cells in a same column will hold values such that the same value will be output on power up.

In some embodiments, wherein each of said feedback loops comprise corresponding devices on either side of said feedback loop, a device on a same side of each of said feedback loops of said substantially all of said storage elements within said each column is formed to be wider than a corresponding mirrored device on the other side of said feedback loops.

The feedback loops comprise corresponding devices and in conventional feedback loops these devices are identical. In order to gain the desired asymmetry in some embodiments, one of the devices can be formed to be wider than a corresponding mirrored device on the other side of the feedback loop. This would give the required asymmetry and would make the storage element predisposed to store a particular value on power up.

In some embodiments, the devices on the feedback loop are formed such that one is longer than a corresponding mirrored device on the other side of the feedback loop.

An alternative way of creating the desired asymmetry is to form one of the devices to be longer than another of the devices.

In some embodiments, a same side of each of said feedback loops of said substantially all of said storage elements within said each column is formed to have a higher capacitance than another side of each of said feedback loops.

The desired asymmetry can be derived by forming one side of the feedback loop to have a higher capacitance than the other. This is a fairly simple thing to arrange and yet produces the desired affect of such a feedback loop preferentially storing a predetermined value on powering up.

In some embodiments each of said feedback loops comprise a device on either side of said feedback loop, a device on one side of said feedback loop of said substantially all of said storage elements within said each column being formed to have a higher threshold voltage than a device on the other side.

An alternative way of providing the desired asymmetry is to provide the devices on either side to have differing threshold voltages. These voltages can be selected such that the desired value will be stored in the storage element on powering up.

In some embodiments, said array is responsive to a signal indicating power critical code is to be executed to store a same value in substantially all of said storage elements in each column prior to executing said power critical code.

In addition to the output of an array of storage elements being meaningless at power up it is also meaningless when power critical code is executed to determine the efficiency of the device. In cases where the output of the array is not required, then power savings can be made if all or substantially all of the different storage elements in each column store the same value. Thus, power savings can be made if the array is responsive to a signal indicating that such code is to be executed to store a same value in elements in each column of the array.

In some embodiments, substantially all of said storage elements comprise more than 80% of these storage elements.

In other embodiments substantially all of the said storage elements comprise more than 90% of these elements.

A second aspect provides a method of improving the power consumption of an array of storage elements arranged in rows and columns and each comprising a feedback loop, said method comprising the step of: when values output by said array of storage elements are not required storing a same value in substantially all of said storage elements in a same column of said array of storage elements.

When the values output by the array of storage element are not required, such as on power up and during the running of power critical code, then power savings can be made if a same value is stored in substantially all of the storage elements in each column in the array. Thus, when values output by the array of storage elements are not required and in response to this store the same value in substantially all of the storage elements in a same column in the array.

In some embodiments, a first step of determining that power critical code is to be run such that values output by said array of storage elements will not be required, said method comprising a further step of running said power critical code to assess a performance of said array of storage elements.

If power critical code is to be run, then if the method determines that this is to happen a further step can be performed prior to running this code to store the same value in all of the storage elements in the array.

In some embodiments, this storage step is done by writing the same value to each storage element in a same column in the array.

In other embodiments said step of storing a same value in substantially all storage elements in a same column in said array comprises powering down and then powering up said array of storage elements, substantially all of said storage elements in said same column having a same asymmetry such that on initialization when no signal is received at a data input a same predetermined value is preferentially stored in substantially all of said storage elements in said same column.

A third aspect provides an array of storage elements arranged in rows and columns, each comprising a data input and output and a feedback loop, each of said storage elements in a same column being designed to have a same asymmetry such that on power up when no input data signal is received a same predetermined value is preferentially stored in substantially all of said feedback loops in said same column.

A plurality of storage elements is provided in which each feedback loop is designed to have a same asymmetry such that on power up they substantially all store the same value. As they have all been designed to have the same asymmetry they should all preferentially store the same value on power up. It will be clear that manufacturing tolerances may be such that they don't all, but that the number that don't is small depending to some extent on the manufacturing process used.

A fourth aspect provides a memory cell design, said memory cell design comprising a storage element comprising a data input and output and a feedback loop, said storage element being designed to have a certain asymmetry such that on power up when no input data signal is received a predetermined value is preferentially stored in said feedback loop.

A design of an individual memory cell can be made such that the storage element is designed to have a certain asymmetry to provide preferential storage of a certain value on power up. Conventionally storage elements with feedback loops are designed to be as symmetrical as possible and it would not be desirable in conventional system to make these cells asymmetric.

A fifth aspect of the present provides a memory design comprising plurality of memory cell designs according to the fourth aspect, each of said memory cells having feedback loops with an asymmetry such that on power up a predetermined value is preferentially stored in said feedback loops such that all of said storage elements will output a same value.

Although, when these are built it may be that not all of the feedback loops will have the desired asymmetry due to manufacturing tolerances, all the cells in the design have this asymmetry, such that on power up they would all output a same value.

The above, and other objects, features and advantages will be apparent from the following detailed description of illustrative embodiments which is to be read in connection with the accompanying drawings.

DETAILED DESCRIPTION

Figure 1:
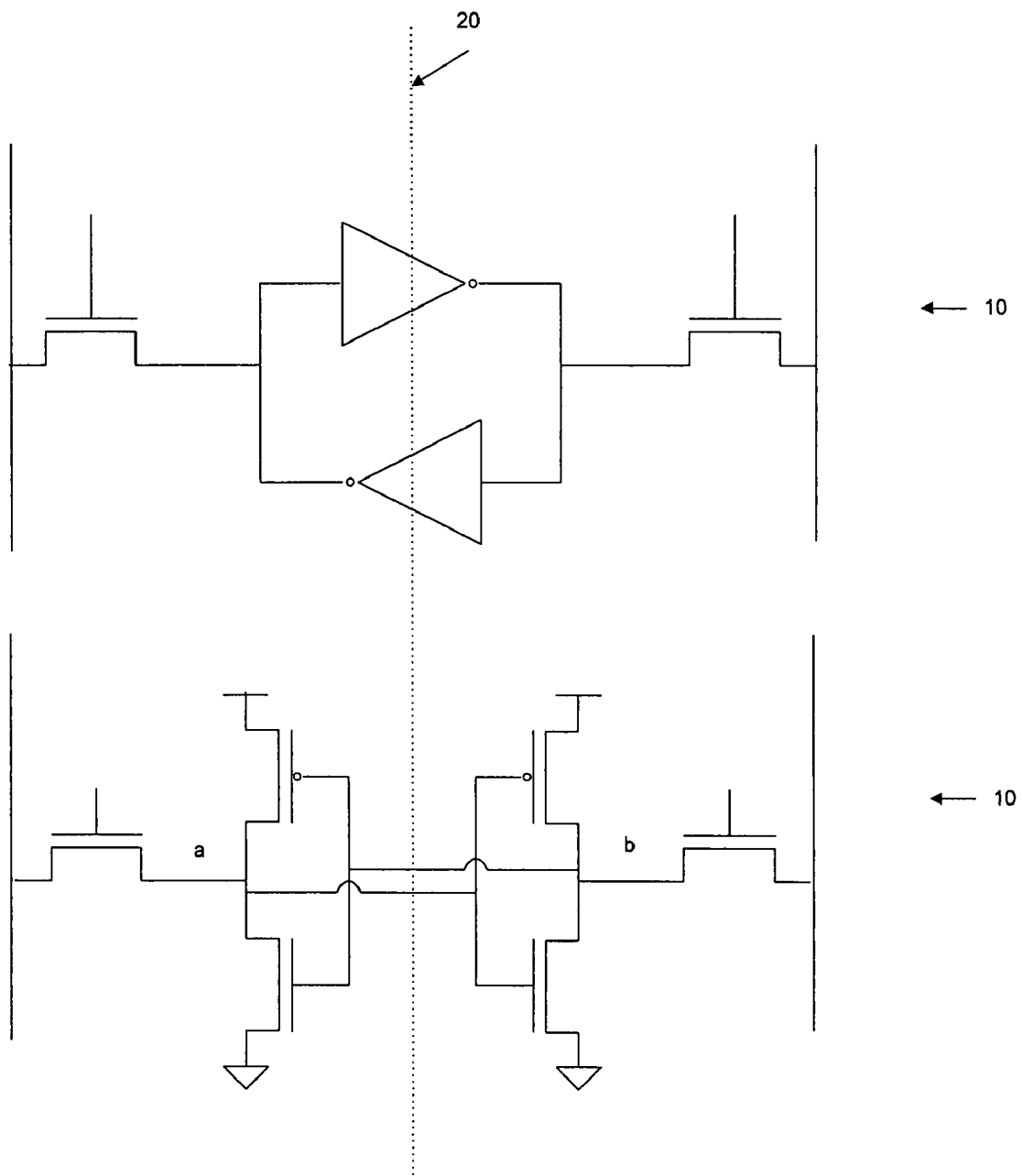
FIG. 1 shows a memory bit cell according to the prior art.
Figure 2A:
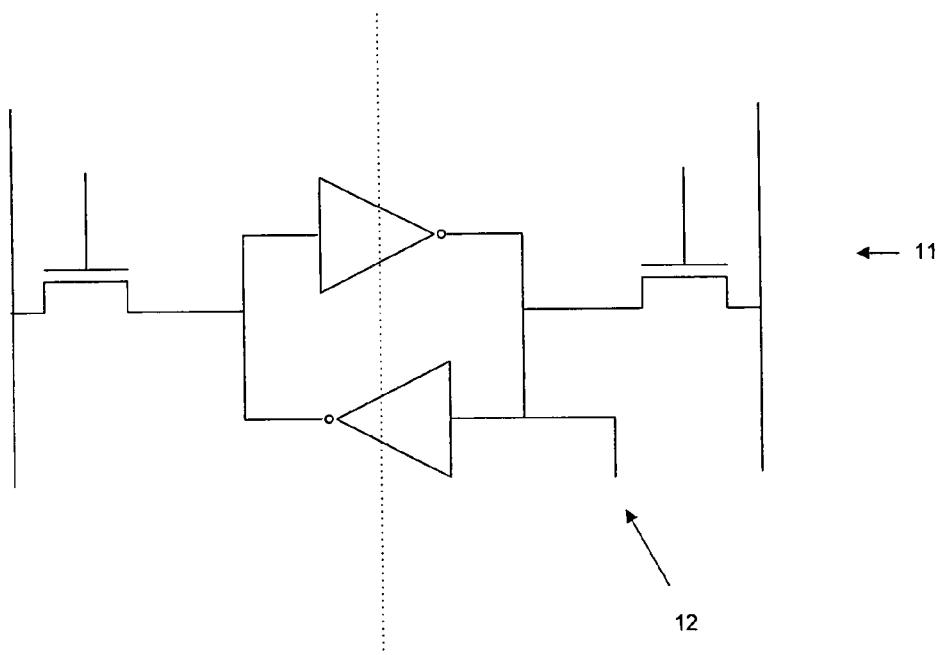
FIG. 2a shows a memory bit cell according to an example embodiment.

FIG. 2a shows a memory bit cell 11 according to an example embodiment. This memory bit cell is very similar to the conventional memory bit cell shown in FIG. 1 but has an additional wire 12 on one side of the loop. This wire is there simply to provide increased capacitance on this side of the loop. This is sufficient to generate an asymmetry in the device and to cause it to preferentially store a certain value on power up. Thus, if all the bit cells in a memory SRAM were formed in this way, on power up you could be relatively certain that they all or at least nearly all would store the same value. It should be noted that some may store a different value, as at manufacture some of the increased capacitance might not occur due to problems with tolerances in the build.

Figure 2B:
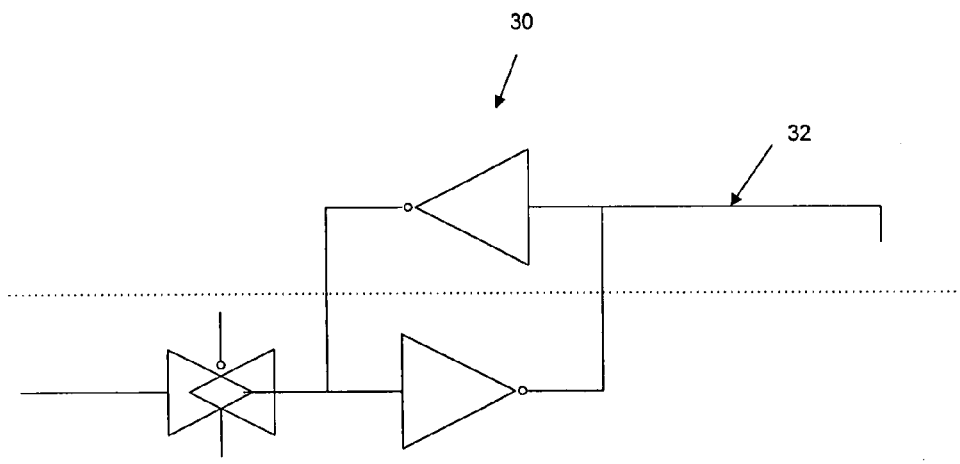
FIG. 2b shows a latch according to an example embodiment.

FIG. 2b shows a latch 30 according to an example embodiment. It is similar to the bit cell of FIG. 2a and similarly also has an additional wire 32 to generate an increased capacitance on one side of the loop which renders it liable to preferentially store a predetermined value on power up. An array can be formed of these latches such that they are all predisposed to store a particular value on power up.

Figure 3:
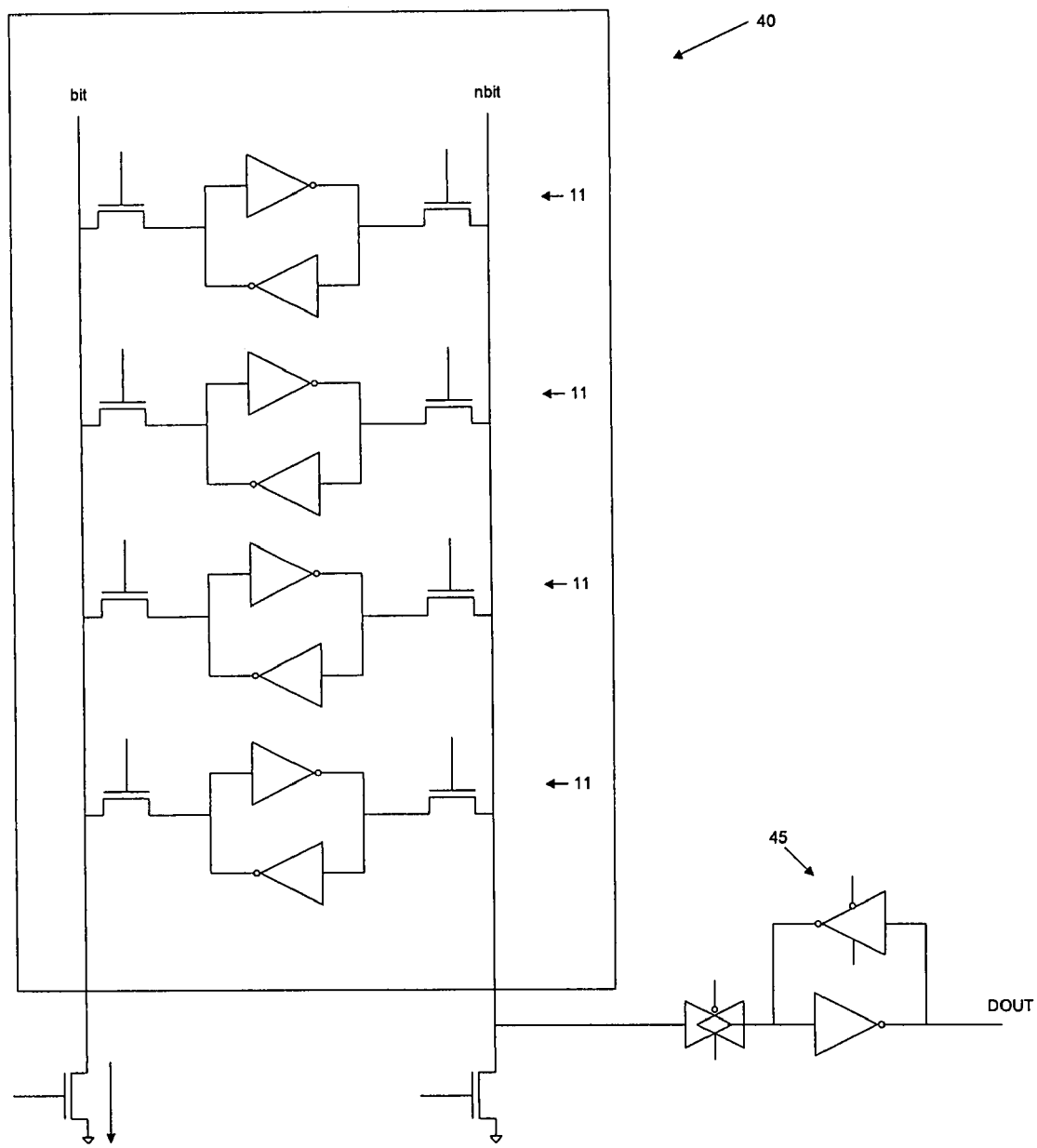
FIG. 3 shows an SRAM memory according to an example embodiment.

FIG. 3 shows schematically a column of an SRAM memory 40 comprising a plurality of bit cells 11. This memory comprises bit lines and nbit lines. These lines can be used to input data depending on whether a one or zero is desired, and one of them (or both of them if complementary data is required) can be used to output data. In this embodiment it is the nbit lines that output the data. There is an output data stage 45 for each column which takes the form of a latch on the nbit line. This output data stage, receives data from the nbit line of a particular memory bit cell depending on which cell is addressed. Thus, if all the memory bit cells store the same value on power up, although values from different cells will be output the output stage 45 will not toggle. Toggling of the output stage 45 costs power and thus, if the output data value is not of interest it is advantageous to avoid toggling of this output stage 45.

In the embodiments shown, the memory bit cells 11 are asymmetric due to additional wire on one side of the loop, which increases the capacitance on this side. Although in this embodiment the asymmetry is achieved by an additional wire, clearly this asymmetry could be achieved in a number of other ways. For example, the inverter pairs on one side of the loop could be made wider or longer than the inverters on the other side. Alternatively, they could be made with a higher threshold voltage than the ones on the other side. Provided, it is always the same side of the loop that has the same properties in each of the cells then this asymmetry acts such that all of the cells store the same value on power up.

It should be noted, that when forming these cells sometimes columns of them are formed by making the cells in different columns mirror images of each other. Embodiments can be formed in this way provided that the mirror image cells use the opposite bit line as its data output line. In such a case the cells still have the same asymmetry although this manifests itself in an opposite direction, such that opposite values are preferentially stored. However, the same value is preferentially output as the opposite bit line is used. It will be clear to the skilled person that many variations could be envisaged all lying within the scope of the claims.

Figure 4:
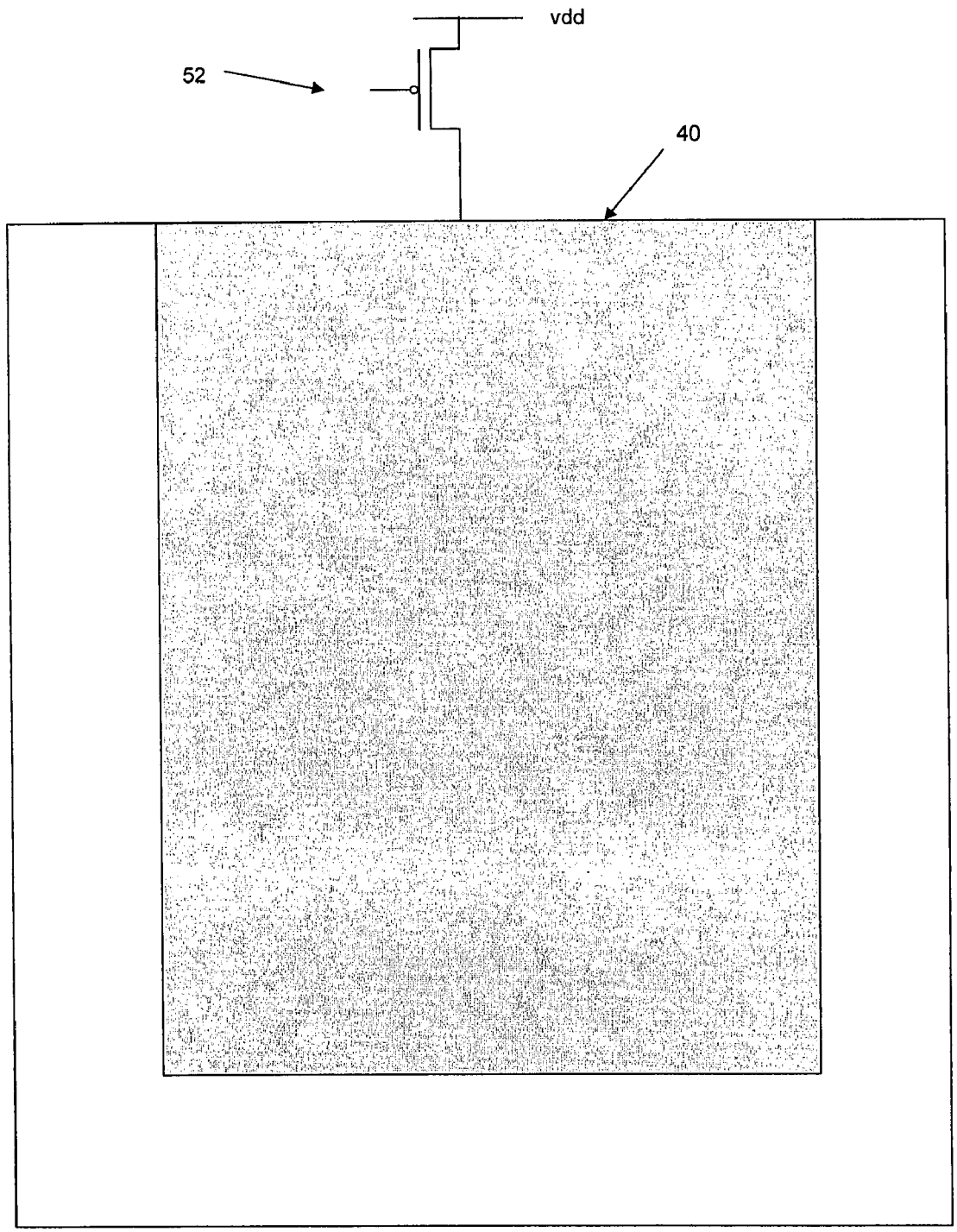
FIG. 4 shows the power gating of such an SRAM memory.

FIG. 4 schematically shows an SRAM block 40 that is powered from a VDD line and is gated by a power transistor 52. Power can be turned on and off to the SRAM array via the use of this power transistor 52. Thus, the array itself can be powered down without the surrounding circuitry being affected. It should be noted, that it may be desirable to power down the array and then power it back up again in order to achieve the same value stored in all of the cells of the array. This may be desirable when for example power critical code is to be run. Power critical code is run to determine the power efficiency of a system. When running such code it is the power consumption that is interesting and not the data output by a memory. Thus, if the memory were to store values such that the same value is output by each cell at the output stage, then this output stage would not toggle and the power critical code could be run at lower power. Thus, in such a case it may be desirable to set the memory array so that all the cells store the same value. This can be done by writing the same value to all the cells in the array, alternatively it can be done by simply turning the power transistor 52 off and back on again. Care must be taken that the array does actually power down such that the voltage across it collapses enough for the previously stored values to be lost.

Figure 5:
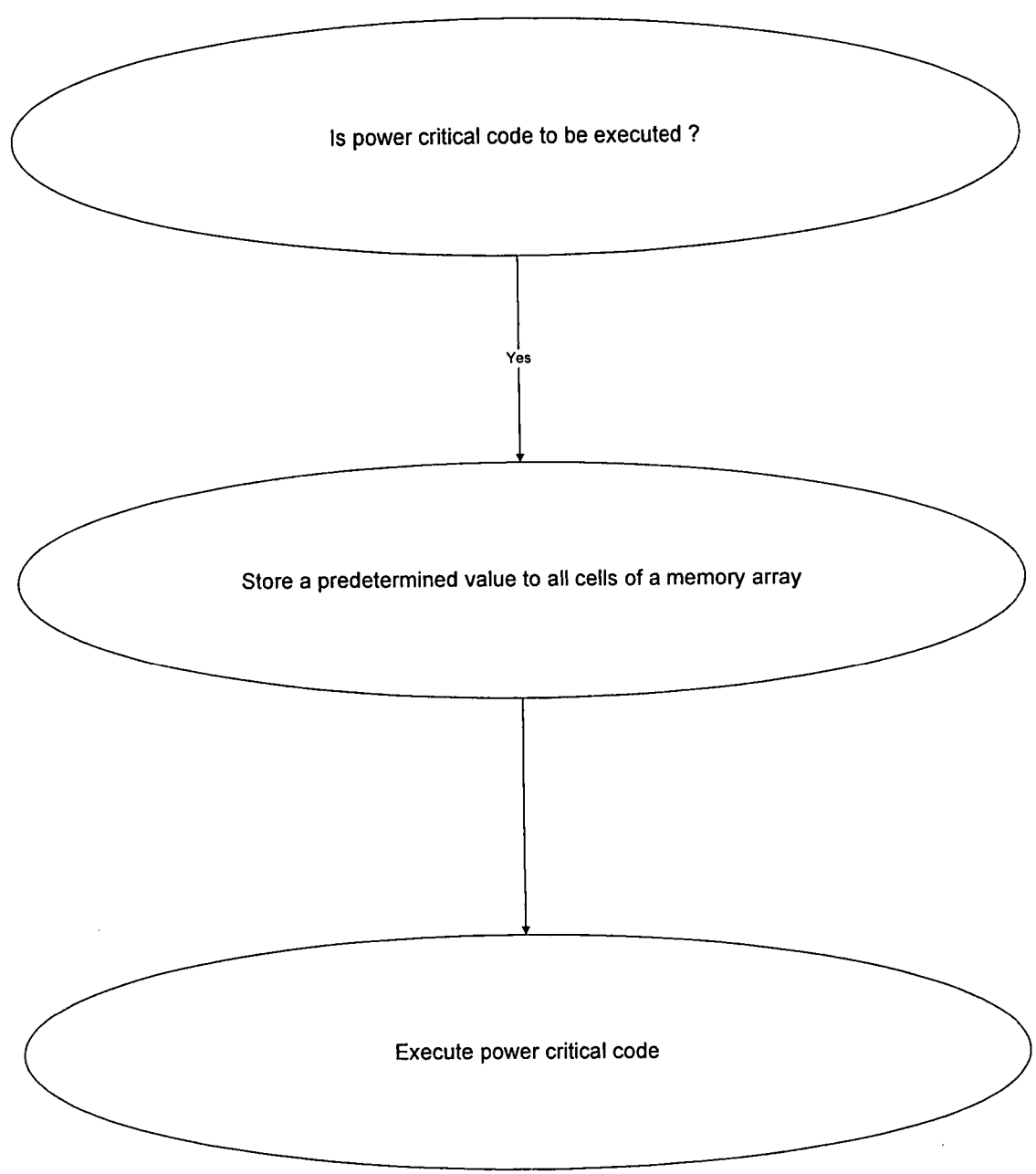
FIG. 5 shows a flow diagram illustrating steps of a method according to an example embodiment.

FIG. 5 is a flow diagram illustrating a method according to an example embodiment. Initially the system checks to see if power critical code is to be executed. If it is then a predetermined value is stored to all cells of the memory array before this code is executed. This can be done by writing to the memory array or it can be done by powering the array down and then back up again as was described with respect to FIG. 4. Once this has been done the power critical code can be executed and the output stage of the memory array will not toggle unnecessarily and power can be saved.

Figure 6:
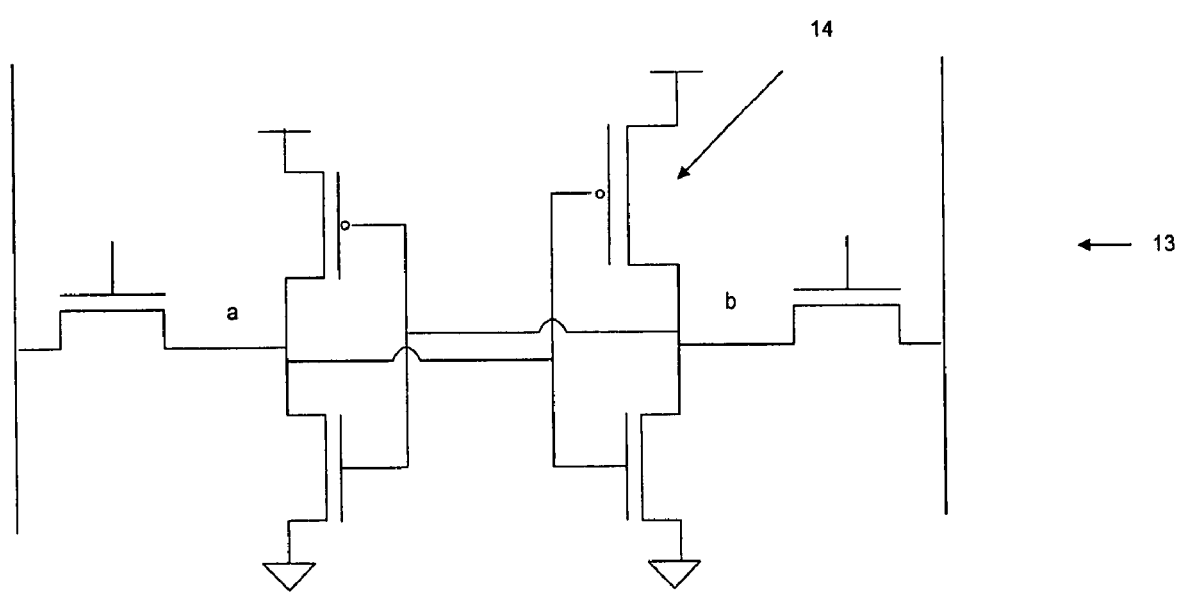
FIG. 6 shows a design of a memory according to an example embodiment.

FIG. 6 shows a memory bit cell design according to an example embodiment. This shows a memory bit cell, which is designed to have one transistor larger of different dimensions to the others. This provides the bit cell with an asymmetry such that it is predisposed to store a certain value on power up.

The memory design would be an array of these bit cells, all designed with the same asymmetry.

Although illustrative embodiments have been described in detail herein with reference to the accompanying drawings, it is to be understood that the claims is not limited to those precise embodiments, and that various changes and modifications can be effected therein by one skilled in the art without departing from the scope and spirit of the appended claims.

We claim:

1. An array of storage elements arranged in rows and columns, each storage element comprising a data input and output and a feedback loop, said storage elements in each column comprising feedback loops formed with an asymmetry such that on power up when no input data signal is received a value is preferentially stored in said feedback loops of said storage elements in said each column such that substantially all of said storage elements in said each column will output a same value, wherein
    each of said feedback loops comprise corresponding devices on either side of said feedback loop, a device on a same side of each of said feedback loops of said substantially all of said storage elements within said each column being formed to be at least one of wider, longer, or to have a higher threshold voltage than a corresponding mirrored device on the other side of said feedback loops.

2. An array of storage elements according to claim 1, said array further comprising an output stage, said output stage being formed to receive data to be output from a column of storage elements of said array and to hold said data until further data to be output is received at said output stage.

3. An array of storage elements according to claim 2, wherein said output stage comprises a latch.

4. An array of storage elements according to claim 1, wherein substantially all of said storage elements are formed from feedback loops comprising a same asymmetry, such that substantially all of said feedback loops preferentially store a same value.

5. An array of storage elements according to claim 1, wherein said storage elements comprise latches.

6. An array of storage elements according to claim 1, wherein said storage elements comprise flip flops.

7. An array of storage elements according to claim 1, wherein said storage elements comprise memory bitcells, said feedback loops comprise a pair of back to back inverters, and said array comprises an SRAM memory.

8. An array of storage elements arranged in rows and columns, each storage element comprising a data input and output and a feedback loop, said storage elements in each column comprising feedback loops formed with an asymmetry such that on power up when no input data signal is received a value is preferentially stored in said feedback loops of said storage elements in said each column such that substantially all of said storage elements in said each column will output a same value, said array being responsive to a signal indicating power critical code is to be executed to store a same value in substantially all of said storage elements within said each column prior to executing said power critical code.

9. An array of storage elements according to claim 8, wherein substantially all of said storage elements comprises more than 80%.

10. An array of storage elements according to claim 9, wherein substantially all of said storage elements comprises more than 90%.

11. An array of storage elements according to claim 8, wherein a same side of each of said feedback loops of said substantially all of said storage elements within said each column is formed to have a higher capacitance than another side of each of said feedback loops.

12. A method of improving the power consumption of an array of storage elements arranged in rows and columns and each comprising a feedback loop, said method comprising the step of:
    when values output by said array of storage elements are not required, storing a same value in substantially all of said storage elements in a same column of said array of storage elements; and
    comprising a first step of determining that power critical code is to be run such that values output by said array of storage elements will not be required, said method comprising a further step of running said power critical code to assess a performance of said array of storage elements.

13. A method according to claim 12, wherein said step of storing a same value in substantially all storage elements in a same column in said array comprises writing said same value to each storage element in said array.

14. A method according to claim 12, wherein said step of storing a same value in substantially all storage elements in a same column in said array comprises powering down and then powering up said array of storage elements, substantially all of said storage elements in said same column having a same asymmetry such that on initialization when no signal is received at a data input a same predetermined value is preferentially stored in substantially all of said storage elements in said same column.

15. A memory design comprising a plurality of memory cell designs arranged in rows and columns, each memory cell design comprising a storage element comprising a data input and output and a feedback loop, each of said feedback loop in each of said memory cell designs comprising corresponding devices on either side of said feedback loop, a device on a same side of each of said feedback loops of said substantially all of said storage elements within said each column being formed to be at least one of wider, longer, or to have a higher threshold voltage than a corresponding mirrored device on the other side of said feedback loops, such that on power up a value is preferentially stored in said feedback loops such that all of said storage elements in a same column will output a same value.

* * * * *